United States Patent [19]
Passerini et al.

[11] Patent Number: 5,436,473
[45] Date of Patent: Jul. 25, 1995

[54] GATE LEAD FOR CENTER GATE PRESSURE ASSEMBLED THYRISTOR

[75] Inventors: Bruno Passerini, Balangero; Claudio Malfatto, Cafasse; Silvestro Fimiani, Turin, all of Italy

[73] Assignee: International Rectifier Corporation, El Segundo, Calif.

[21] Appl. No.: 175,784

[22] Filed: Dec. 30, 1993

[51] Int. Cl.⁶ .............................................. H01L 23/42
[52] U.S. Cl. ..................................... 257/177; 257/181
[58] Field of Search ................................. 257/177, 181

[56] References Cited

U.S. PATENT DOCUMENTS 5,371,386  12/1994  Tokunoh et al. ................. 257/181

FOREIGN PATENT DOCUMENTS 439003  7/1991  European Pat. Off. .
103343  6/1982  Japan .

Primary Examiner—William Mintel
Assistant Examiner—Roy Potter
Attorney, Agent, or Firm—Ostrolenk, Faber, Gerb & Soffen

[57] ABSTRACT

The gate lead for a center gate thyristor consists of a contact disk connected to the end of an elongated flexible conductive lead wire which is insulated over its major length. The lead is threaded through the central opening in a plunger which is received in a central opening in the pole piece and terminates in a contact disk which is captured against the bottom of the plunger. A compression spring is captured between the other end of the cylinder and the plunger, thereby to press the contact disk into high pressure contact with the gate electrode on the junction when the device is assembled. The opposite end of the gate lead wire is connected to a terminal which can be easily connected to the interior end of the gate pin which extends through the insulation housing of the assembly.

21 Claims, 7 Drawing Sheets

GATE LEAD FOR CENTER GATE PRESSURE ASSEMBLED THYRISTOR

BACKGROUND OF THE INVENTION

This invention relates to high power compression assembled thyristors, and more specifically relates to a novel spring biased center gate lead structure for such devices.

Compression assembled housings for high power semiconductor housings are well known, and generally comprise a pair of massive copper pole pieces coaxially fixed to the opposite ends of a support ceramic cylinder and projecting into the cylinder. A semiconductor wafer having the necessary P-N junctions therein to define a thyristor is then fixed in position between the opposite flat, parallel interior surfaces of the respective pole pieces. This wafer is commonly termed a "junction". The junction has main electrodes on its opposite surfaces, and these are engaged with high pressure by the respective pole pieces when they are put under clamping pressure.

The gate or control electrode for the thyristor is commonly located at the center of the top of the wafer or junction. Thus, a gate lead must be fixed to the center gate electrode and attached to a gate pin which extends through the ceramic insulator during the assembly of the housing. Such gate leads can break during assembly or can make poor contact to the center junction electrode or pin. The assembly operation is therefore tedious and the gate connection unreliable.

BRIEF SUMMARY OF THE INVENTION

In accordance with the invention, a novel spring biased contact system is provided for making contact to the center gate of a thyristor junction. The contact system is carried totally in the upper pole piece and has a free contact end to be connected to the interior of the gate pin before the pole pieces and cylinder are fixed together.

The gate contact consists of an insulation cylinder which is fixed in an opening in the top pole. A spring plunger is movably mounted within the cylinder, and a compression spring presses the plunger away from the pole piece and toward the junction. The lead wire extends through an opening along the axis of the plunger and terminates at one end with an enlarged contact disk which is pressed between the outer end of the plunger and the center gate electrode on the junction. The gate lead then extends along a slot in the top pole piece and terminates in a connector which is easily connected to the interior end of the gate which extends through the wall of the ceramic insulator.

The novel gate lead structure is fully supported in the upper pole piece, and permits easy assembly of the pole pieces, ceramic insulator and junction in a reliable manner, and ensures good contact to the gate electrode of the junction when the pole pieces are assembled.

Other features and advantages of the present invention will become apparent from the following description of the invention which refers to the accompanying drawings.

DETAILED DESCRIPTION OF THE DRAWINGS

Figure 1:
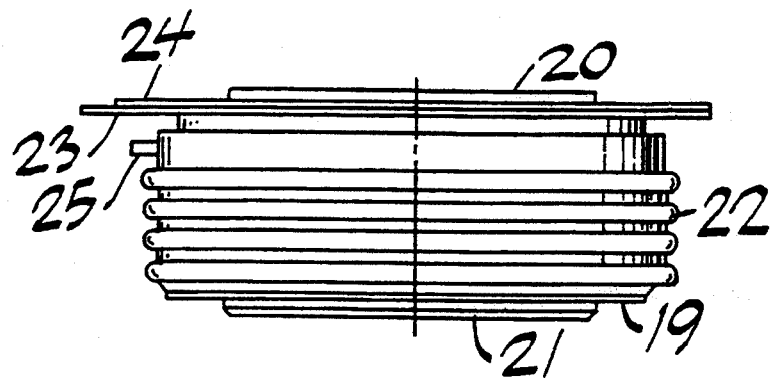
FIG. 1 is an elevational view of a typical pressure assembled thyristor which can employ the novel gate contact of the invention.
Figure 2:
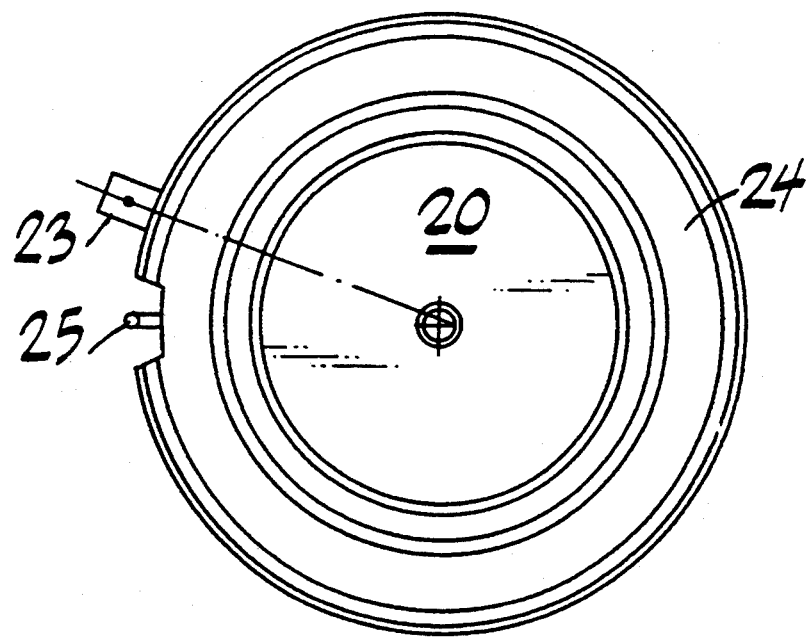
FIG. 2 is a top view of the device of FIG. 1.

Referring first to FIGS. 1 and 2, there is shown therein the outline of a typical pressure assembled power semiconductor device, and shows the device as having an upper copper pole piece 20, a lower copper pole piece 21 (FIG. 1) and a ceramic insulator 22 (FIG. 1) which receives the two pole pieces 20 and 21. The top and bottom surfaces of the pole pieces 20 and 21 are flat and parallel and are mounted between housing heat sinks (not shown) which press the pole pieces toward one another by conventional means.

Figure 11:
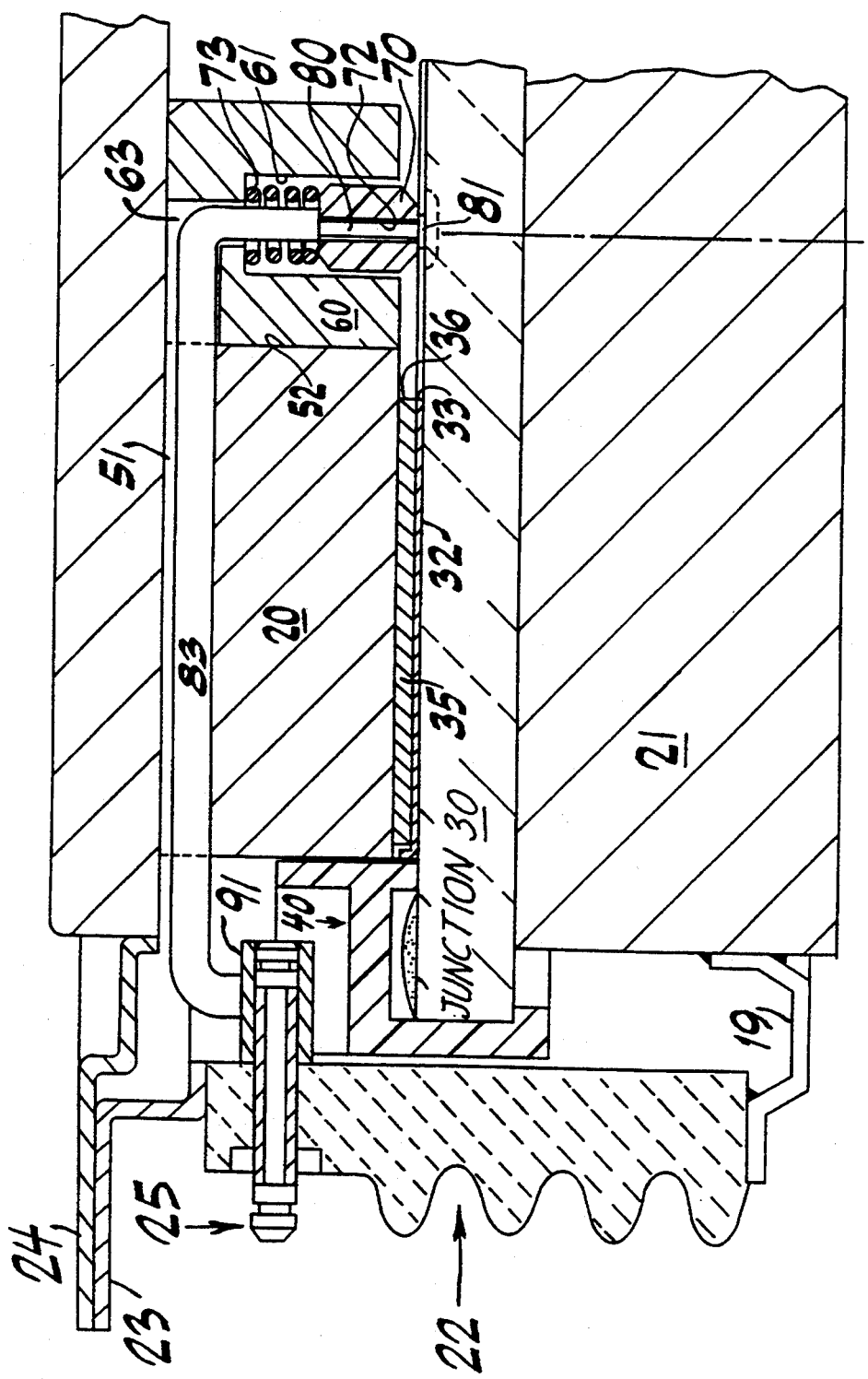
FIG. 11 shows, in enlarged cross-section, the gate lead assembly, as assembled in the pressure assembled housing.

The lower pole piece 21 has a copper flange 19 (FIG. 11) which connects it to the bottom of insulator 22. The top of insulator 22 has a flange 23 (FIGS. 1, 2 and 11). The upper pole piece 20 has a mounting flange 24 which is welded to flange 23 to assemble the package and seal the interior of the package. A gate pin 25 extends through the ceramic insulator 22 and can be connected to the gate electrode of a junction connected to the interior of the housing. The gate pin 25 must be connected to the gate electrode of the junction before the package is sealed at flanges 23 and 24.

The housing outline of FIGS. 1 and 2 is typical of a number of different package outlines which can be used with the present invention.

Figure 3:
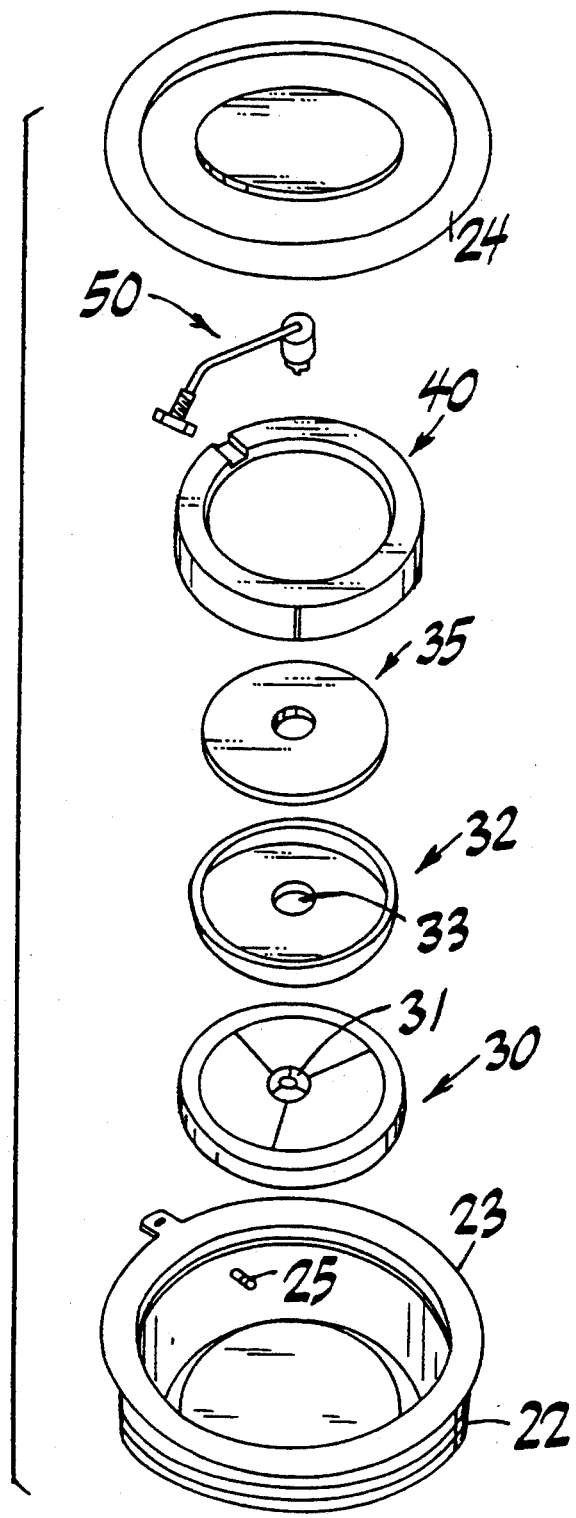
FIG. 3 is an exploded perspective view of the device of FIGS. 1 and 2, using the novel gate lead assembly of the invention but without pole pieces in place.

FIG. 3 shows an exploded perspective view of the housing of FIGS. 1, 2 and 11 (without pole pieces) and shows the use of a junction 30 having a center gate electrode 31. Note that junction 30 may be any type of semiconductor device, but typically will be a thyristor. A silver washer 32 (FIGS. 3 and 11) is disposed atop the main upper electrode of junction 31 (FIG. 11). Washer 32 has a opening 33 large enough to prevent contact to the center gate electrode of junction 30. A molybdenum washer 35 having an opening 36 is disposed atop the silver washer 32.

A molded silicone junction locator 40 (FIGS. 3 and 11) encloses the junction 30, washers 32 and 35 and the bottom of pole piece 20 as shown in FIG. 11, to locate the junction relative to pole piece 20 and insulator 22 and to keep the junction from moving freely within the housing. FIG. 3 also shows the novel gate assembly 50 which will be later described in detail.

As shown in FIG. 11, the bottom surface of junction 30 (which is metallized) contacts the flat upper surface of pole piece 21.

Figure 4:
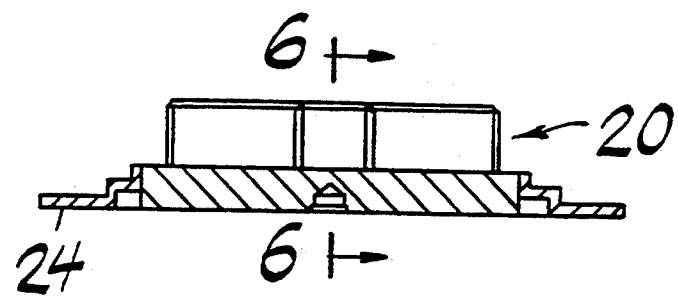
FIG. 4 is a side view of the top pole piece of FIGS. 1, 2 and 3.
Figure 5:
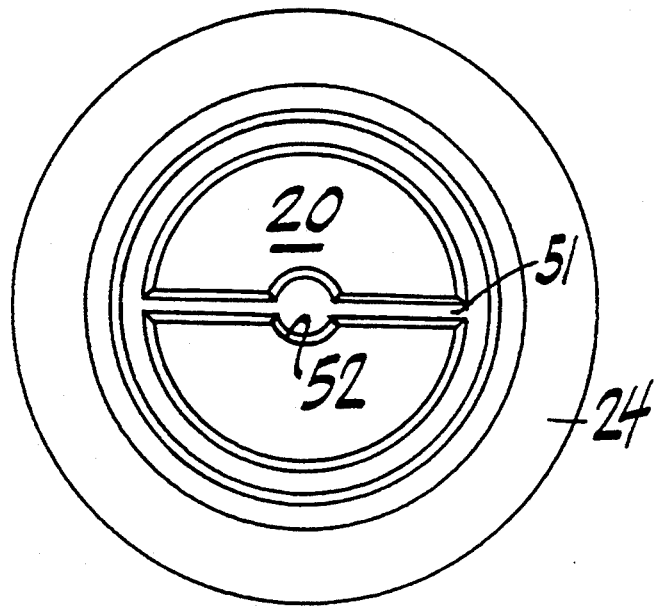
FIG. 5 is a top view of FIG. 4.
Figure 6:
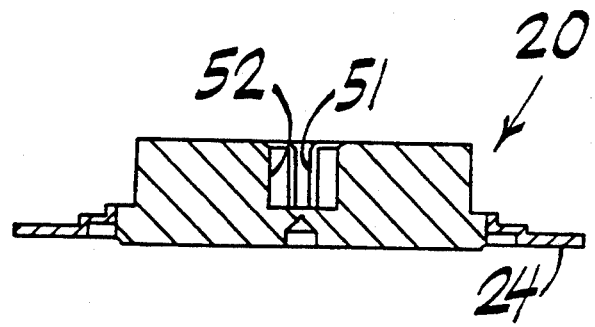
FIG. 6 is a cross-sectional view of FIG. 4 taken across the section line 6—6 in FIG. 4.

FIGS. 4, 5 and 6 show the manner in which pole piece 20 is prepared to employ the gate contact assembly 50 of FIG. 3. Thus, a slot 51 is cut across the interior diameter of the pole piece 20, and an enlarged central opening 52 (FIGS. 5 and 6) is formed along the axis of the pole piece. The slot 51 allows room for the gate lead while opening 52 receives the gate spring assembly housing.

Figure 7:
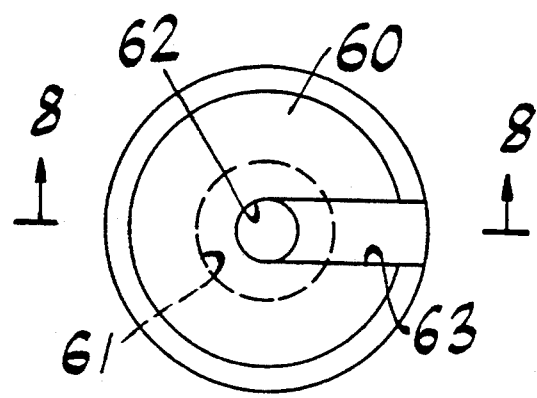
FIG. 7 is a top view of the gate assembly insulator housing.
Figure 8:
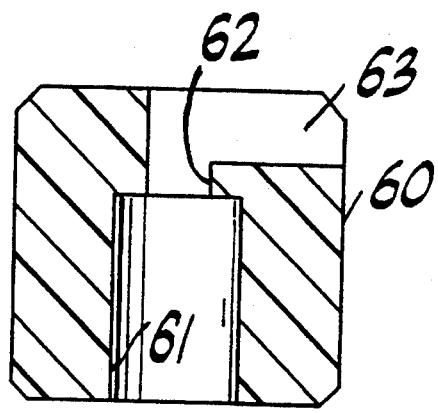
FIG. 8 is a cross-section of FIG. 7 taken across the section line 8—8 and FIG. 7.
Figure 10:
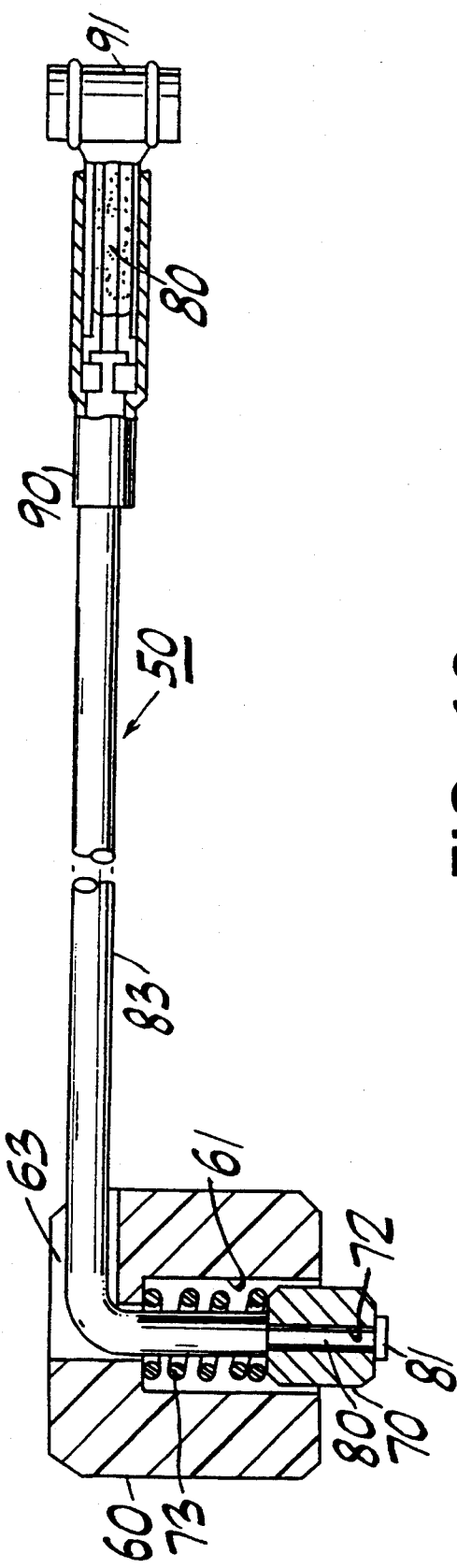
FIG. 10 shows the internal gate lead assembly.

Thus, the gate lead assembly 50, as shown in FIG. 10, includes a gate locator 60 (FIGS. 7, 8 and 11) (or gate assembly housing cylinder) which is of any suitable molded insulation material, for example, an insulator having the trade name FORTRON. Housing 60 has a central opening 61 which leads to a smaller upper opening 62. A notch 63 extends across the radial top of housing 60.

Figure 9:
FIG. 9 shows the gate lead and its enlarged contact head for the gate assembly.

A ceramic insulator spring plunger 70 is slidably movable within opening 61 (FIGS. 1 and 11) and has an axial opening 72 therethrough. Compression spring 73 is then captured atop plunger 70. The gate lead 80 (FIG. 9), which may be silver plated copper, has a contact disk or head 81 formed at its end. The diameter of wire 80 for its full length may be about 0.4 millimeters and the diameter of head 81 may be about 1 millimeter. The wire 80 is threaded through opening 71 until head 81 seats on the bottom of plunger 70. An insulation sleeve 83 encloses the length of lead wire 80 as shown in FIGS. 10 and 11.

The opposite end of lead wire 80 from head end 81 receives a suitable connector to enable connection of the lead wire to the interior side of pin 25, as shown in FIGS. 10 and 11. Thus, a sleeve 90 (FIG. 10) is crimped onto the end of wire 80 and wire 80 is then soft soldered to the interior of the sleeve 90 of slide-on connector 91. As shown in FIG. 11, the connector makes slide connection over the interior end of pin 25.

It will now be understood that the novel gate lead assembly 50 permits simple and reliable assembly of the gate lead in a pressure assembled package or housing. Thus, the lead 80 is simply laid into slot 51 of pole piece 20, and housing 60 is pressed into opening 52 in the pole piece. The gate lead assembly is now fully subassembled with pole piece 20. The connector 91 is then connected to pin 25, and the housing can be completely assembled without fear of losing the gate connection. Once the housing is assembled, contact head 81 is automatically pressed into contact with the center gate of junction 30 by spring 73.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A gate connection system for a compression assembled semiconductor device, said semiconductor device comprising first and second spaced pole pieces, an insulation housing surrounding and insulating said first and second pole pieces from one another; a gate pin extending through said insulation housing; a thin flat junction captured between said pole pieces and in pressure contact with said pole pieces over at least a substantial portion of their full surface areas; said junction having at least one gate electrode area on at least one surface thereof which faces said first pole piece; said gate connection system comprising an elongated gate wire mounted on said first pole piece, a wire connection region connected to one end of said wire and aligned with said gate electrode area, an insulation cylinder fixed to said first pole piece, said fixed insulation cylinder having a central axially directed opening extending into said cylinder from a surface of said cylinder facing said gate electrode area, said central axially directed opening receiving a movable plunger formed of insulating material and a compression spring, said compression spring being disposed between a base of said central axially directed opening and said plunger for pressing said plunger toward said gate electrode area of said junction; said gate wire extending through an axially directed opening in said plunger and contacting said wire connection region, said wire connection region being disposed at a surface of said plunger opposite said compression spring and facing said gate electrode area, said plunger forcing said wire connection region toward said gate electrode area when said system is fully assembled, and connection means on the other end of said wire for making connection to said gate pin at the interior of said insulation housing.

2. The gate connection system of claim 1 wherein said gate electrode area is in the center of said junction.

3. The gate connection system of claim 1 wherein said first pole piece has a slot in the surface thereof for receiving said gate wire beneath the surface of said first pole piece in the space between said gate pin and said gate connection area.

4. The gate connection system of claim 1 wherein said first pole piece has a cylindrical recess for receiving said spring biasing means.

5. The gate connection system of claim 1 wherein said gate connection system components are all mounted within said first pole piece.

6. The system of claim 1 wherein said first pole piece and the end of said insulation housing adjacent said first pole piece have respective conductive circular flanges which are connected together to seal the interior of said insulation housing.

7. The system of claim 1 wherein said base of said central axially directed opening of said fixed insulation cylinder leads to a second central axially directed opening of reduced diameter in said fixed insulation cylinder, said second opening of reduced diameter being co-axially aligned with said opening for receiving said movable plunger and said compression spring, said second opening in turn leading to a radial notch in said cylinder, said radial notch having a longitudinal axis perpendicular to the axis of said second opening, and wherein said gate wire extends through said notch and said second opening in said cylinder.

8. The gate connection system of claim 2 wherein said first pole piece has a slot in the surface thereof for receiving said gate wire beneath the surface of said first pole piece in the space between said gate pin and said gate connection area.

9. The gate connection system of claim 8 wherein said first pole piece has a cylindrical recess for receiving said spring biasing means.

10. The gate connection system of claim 9 wherein said gate connection system components are all mounted within said first pole piece.

11. The gate connection system of claim 2 wherein said first pole piece has a cylindrical recess for receiving said spring biasing means.

12. The gate connection system of claim 11 wherein said gate connection system components are all mounted within said first pole piece.

13. The gate connection system of claim 12 wherein said first pole piece has a cylindrical recess for receiving said spring biasing means.

14. The gate connection system of claim 8 wherein said first pole piece comprises a disk having a center and a periphery, and wherein said slot extends radially from said center of said disk to said periphery of said disk.

15. The system of claim 14 wherein said base of said central axially directed opening of said fixed insulation cylinder leads to a second central axially directed opening of reduced diameter in said fixed insulation cylinder, said second opening of reduced diameter being co-axially aligned with said opening for receiving said movable plunger and said compression spring, said second opening in turn leading to a radial notch in said cylinder, said radial notch having a longitudinal axis perpendicular to the axis of said second opening and aligned with said radially extending slot of said disk, and wherein said gate wire extends through said notch and said second opening in said cylinder.

16. The gate connection system of claim 11 wherein said gate connection system components are all mounted within said first pole piece.

17. The system of claim 2 wherein said first pole piece and the end of said insulation housing adjacent said first pole piece have respective conductive circular flanges which are connected together to seal the interior of said insulation housing.

18. The gate connection system of claim 3 wherein said first pole piece comprises a disk having a center and a periphery, and wherein said slot extends radially from said center of said disk to said periphery of said disk.

19. The system of claim 18 wherein said base of said central axially directed opening of said fixed insulation cylinder leads to a second central axially directed opening of reduced diameter in said fixed insulation cylinder, said second opening of reduced diameter being co-axially aligned with said opening for receiving said movable plunger and said compression spring, said second opening in turn leading to a radial notch in said cylinder, said radial notch having a longitudinal axis perpendicular to the axis of said second opening and aligned with said radially extending slot of said disk, and wherein said gate wire extends through said notch and said second opening in said cylinder.

20. The system of claim 4 wherein said first pole piece and the end of said insulation housing adjacent said first pole piece have respective conductive circular flanges which are connected together to seal the interior of said insulation housing.

21. The system of claim 5 wherein said first pole piece and the end of said insulation housing adjacent said first pole piece have respective conductive circular flanges which are connected together to seal the interior of said insulation housing.

* * * * *